United States Patent
DeSimone et al.

(10) Patent No.: US 6,383,289 B2
(45) Date of Patent: May 7, 2002

(54) APPARATUS FOR LIQUID CARBON DIOXIDE SYSTEMS

(75) Inventors: Joseph M. DeSimone, Chapel Hill; Ruben G. Carbonell, Raleigh, both of NC (US)

(73) Assignees: The University of North Carolina at Chapel Hill, Chapel Hill, NC (US); North Carolina State University, Raleigh, NC (US)

( * ) Notice: Subject to any disclaimer, the term of this patent is extended or adjusted under 35 U.S.C. 154(b) by 0 days.

(21) Appl. No.: 09/794,294

(22) Filed: Feb. 27, 2001

Related U.S. Application Data

(62) Division of application No. 09/235,343, filed on Jan. 22, 1999, now Pat. No. 6,240,936, which is a continuation of application No. 08/991,321, filed on Dec. 16, 1997, now Pat. No. 6,001,418.

(51) Int. Cl.[7] .............................................. B05D 3/12
(52) U.S. Cl. ......................................... 118/52; 118/320
(58) Field of Search ...................................... 118/52, 320

(56) References Cited

U.S. PATENT DOCUMENTS

| | | | |
|---|---|---|---|
| 4,640,846 A | 2/1987 | Kuo | 427/82 |
| 4,794,021 A | 12/1988 | Potter | 427/240 |
| 4,886,012 A | 12/1989 | Ikeno et al. | 118/667 |
| 4,944,837 A | 7/1990 | Nishikawa et al. | 156/646 |
| 5,094,892 A | 3/1992 | Kayihan | 427/440 |
| 5,264,246 A | 11/1993 | Ikeno | 427/240 |
| 5,358,740 A | * 10/1994 | Bornside et al. | 427/240 |
| 5,392,989 A | 2/1995 | Hurtig | 239/119 |
| 5,455,076 A | 10/1995 | Lee et al. | 427/421 |
| 5,466,490 A | 11/1995 | Glancy et al. | 427/422 |
| 5,472,502 A | 12/1995 | Batchelder | 118/52 |
| 5,494,526 A | 2/1996 | Paranjpe | 134/1 |
| 5,496,901 A | 3/1996 | DeSimone | 526/89 |
| 5,591,264 A | 1/1997 | Sugimoto et al. | 118/320 |
| 5,665,527 A | 9/1997 | Allen et al. | 430/325 |
| 5,989,355 A | 11/1999 | Brandt et al. | 134/6 |

OTHER PUBLICATIONS

Ober et al.; Imaging Polymers with Supercritical Carbon Dioxide, *Adv. Materials,* 9(13):1039–1043 (1997).

* cited by examiner

*Primary Examiner*—Zeinab El-Arini
(74) *Attorney, Agent, or Firm*—Myers Bigel Sibley & Sajovec

(57) ABSTRACT

Spin coating apparatuses for applying liquid to substrates include pressure vessels having enclosed chambers therein, holders for rotating substrates positioned in the enclosed chambers, liquid dispensers positioned in the enclosed chambers for depositing a carbon dioxide liquid on the substrates, and pressure reservoirs in fluid communication with the liquid dispensers for storing a carbon dioxide liquid.

15 Claims, 3 Drawing Sheets

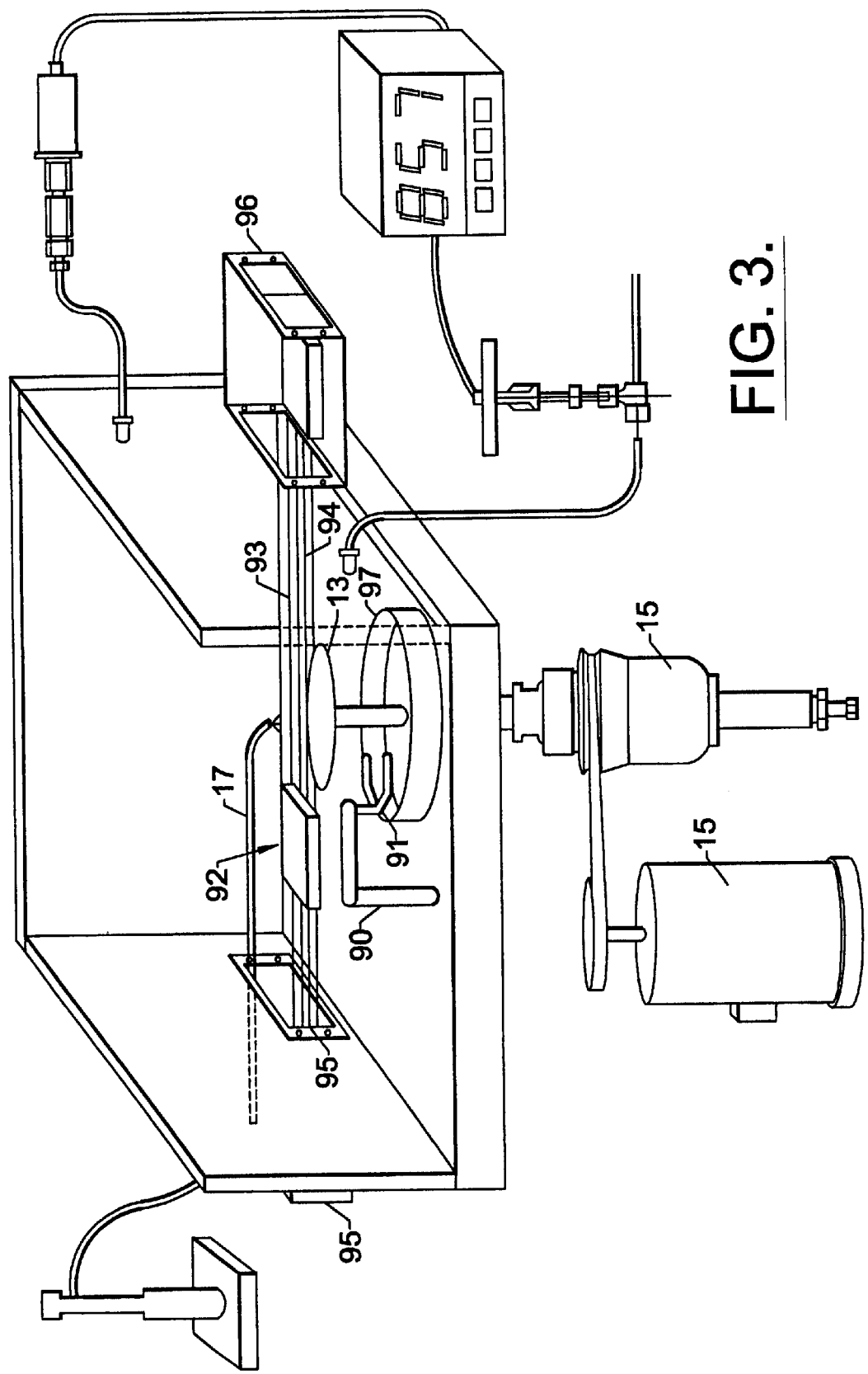

APPARATUS FOR LIQUID CARBON DIOXIDE SYSTEMS

CROSS-REFERENCE TO RELATED APPLICATIONS

The present application is a divisional application of Ser. No. 09/235,343 filed Jan. 22, 1999, now U.S. Pat. No. 6,240,936, which is a continuation of Ser. No. 08/991,312 filed Dec. 16, 1997, now U.S. Pat. No. 6,001,418, the disclosures of which are incorporated herein by reference in their entirety.

FIELD OF THE INVENTION

The present invention relates to spin coating methods and apparatus in which the need to use volatile organic solvents to carry or dissolve the coating material is obviated by the use of liquid carbon dioxide.

BACKGROUND OF THE INVENTION

The microelectronics industry is dependent upon spin coating for the deposition of uniform thin films on various flat substrates, including silicon wafers for integrated circuits and glass for optoelectronic devices. Spin coating processes typically involve the injection of a liquid coating onto a flat substrate that is rotating at a high rate of speed such as several hundred to several thousand RPM. A spin coater operates by spreading a thin liquid layer (liquid coating solution) on a substrate using the centrifugal force of a spinning substrate. The spreading liquid layer then forms a fairly uniform film after evaporation that covers up and planarizes topological unevenness leaving pin-hole free films. The liquid coating solution is typically comprised of a material that has low volatility such as a polymeric material or an oligomer. These low volatile materials are then dissolved in a volatile liquid solvent or liquid solvent mixture. The volatile liquid solvents are typically volatile organic solvents (VOC), chlorofluorocarbons (CFC), hydrochlorofluorocarbons (HCFC), hydrofluorocarbons (HFC), and perfluorocarbons or mixtures thereof such as methyl ethyl ketone (MEK), ethyl acetate, chloroform, toluene, isoamyl acetate, Freon-113, Freon-22, Freon-134a, Freon-227, perfluoromorpholine, etc. The liquid coating solution then thins in a fairly uniform matter across the spinning flat substrate and the excess liquid coating solution falls off the edge of the substrate and is collected. The thin film of liquid coating solution that is retained on the rotating flat substrate continues to evaporate leaving behind a uniform thin film of the compound that has low volatility. The film typically is comprised of a polymeric material (such as a photoresist, interlayer dielectric) but other materials can also be deposited in this way such as low molecular weight compounds (adhesion promoters, antireflective coatings) or sol-gel precursors.

Sometimes a spin coating apparatus is used to remove a substance from a substrate. For example, to develop an exposed photoresist pattern, a liquid solvent is injected onto a substrate that is or will be rotating at a high rate of speed. This liquid solvent can then dissolve the desired substance off the rotating substrate effectively removing the substance off of the rotating substrate.

Spin coating is a solvent intensive process and accounts for a large portion of the use of solvents by the microelectronics industry. Accordingly, there remains a need for spin coating methods and apparatus that reduce or eliminate the use of VOC, CFC, HCFC, HFC, or PFC solvents.

SUMMARY OF THE INVENTION

A first aspect of the present invention is a spin coating apparatus for applying a liquid to a substrate. The apparatus comprises a pressure vessel having an enclosed chamber therein; a turntable for rotating a substrate positioned in the enclosed chamber; a liquid dispenser positioned in the enclosed chamber for depositing a carbon dioxide liquid on that substrate; and a pressure reservoir in fluid communication with the liquid dispenser for storing the carbon dioxide liquid. The apparatus typically includes a pressure controller operatively associated with the chamber that can maintain a pressure within the chamber at about 100 to 10,000 psi.

A second aspect of the present invention is a spin coating method. The method comprises applying a carbon dioxide liquid to surface portion of a substrate; and then rotating the substrate about an axis to distribute the carbon dioxide liquid on the substrate. The carbon dioxide liquid can be distributed on the substrate as a carrier, for the purpose of depositing a material such as a coating on the substrate. In addition, the carbon dioxide liquid can be distributed on the substrate as a solvent, for the purpose of solubilizing, dissolving or removing a material previously deposited on the surface of the substrate.

The foregoing and other objects and aspects of the present invention are explained in greater detail in the drawings herein and the specification set forth below.

BRIEF DESCRIPTION OF THE DRAWINGS

FIG. 3 is a schematic view of a third embodiment of an apparatus of the present invention, including a robotic device for exchanging substrates without opening the main chamber.

DETAILED DESCRIPTION OF THE PREFERRED EMBODIMENTS

Carbon dioxide is a gas at standard pressures and temperatures. One feature of a spin coating apparatus of the present invention is, accordingly, that the carbon dioxide system is provided to the substrate as a liquid. This is necessary because the liquid must spread on the spinning substrate and the volatile components must evaporate from the substrate leaving behind the non-volatile film-forning material. Where the carbon dioxide is utilized as a solvent, this is also necessary to prevent the carbon dioxide from evaporating too quickly to remove the compound to be removed from the substrate.

Figure 1:
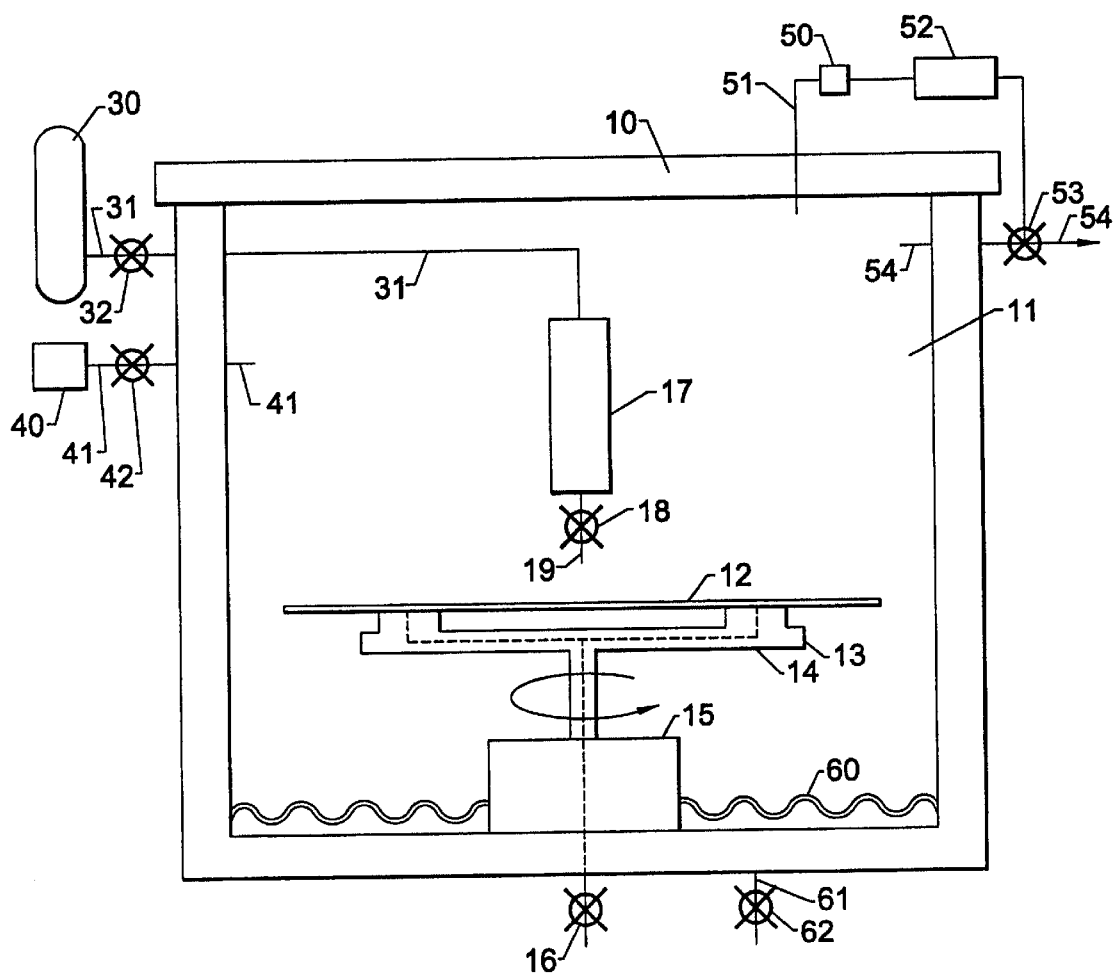
FIG. 1 is a side view of an apparatus of the present invention.

An apparatus for carrying out the present invention is illustrated in FIG. 1. The apparatus comprises pressure vessel 10 having an enclosed chamber 11 therein. The workpiece is a substrate 12 that is positioned in the enclosed chamber for treatment. Any suitable substrate can be employed, including but not limited to glass, ceramic, semiconductor materials such as silicon wafers, compact discs, etc. In general, the substrates have a planar top surface portion to be treated. A turntable 13 that rotates the substrate is positioned within the enclosed chamber, with the turntable being comprised of a holder 14 and a spinning mechanism (e.g., a motor or motor and drive system) 15. Any spinning mechanism can be employed, with speeds of about 10 to 10,000 revolutions per minute being typical. The holder illustrated holds the substrate by differential pressure leads, and a differential pressure control 16, thus serving as a holding or retaining means for securing the substrate to the turntable while the substrate is spun about the turntable axis, but the substrate could be held in place by any suitable means, such as pins, clamps, adhesive, etc. Multiple substrates can be provided on a single turntable, as described in U.S. Pat. No. 4,640,846 (the disclosures of all U.S. Patent references cited herein are to be incorporated herein by reference).

A liquid dispenser 17 is positioned in the enclosed chamber above the substrate so that it can deposit a carbon dioxide liquid on the substrate through valve 18 to nozzle 19. A pressure reservoir 30 for storing a carbon dioxide liquid is located outside of the chamber and is in fluid communication with the liquid dispenser by line 31, under control of valve 32. A pressure pump 40 (e.g., a syringe pump or a diaphragm pump) is connected to the chamber by line 41 and valve 42 to elevate the pressure within the chamber to a suitable operating pressure, as discussed below.

A pressure transducer 50 is connected to the chamber by line 51. The pressure transducer is operatively associated with a pressure controller 52 for controlling valve 53, which allows the atmosphere within the chamber to be vented in a controlled manner as needed by line 54. As will be appreciated, since the chamber is a closed system, once an initial pressure is achieved by charging the chamber with pressure pump 40, as additional material, particularly carbon dioxide liquid, is provided into the chamber, pressure may need to be released by venting through line 54 to maintain the desired pressure.

A pool of carbon dioxide liquid 60 is provided in the chamber, which pool may be drained by line 61 and valve 62. Such a pool may be used to control the differential pressure of the carbon dioxide between the liquid deposited on the substrate and the atmosphere in the chamber, as discussed below.

If desired, the liquid dispenser 17 can dispense carbon dioxide liquid, and the polymer or other compound to be mixed with the liquid and deposited on the substrate can be separately dispensed onto the substrate where it is thereon mixed with the liquid. In addition, the liquid dispenser nozzle may be modified to control the shape or rate at which the liquid is dispensed, as described in U.S. Pat. No. 5,392,989 to Hurtig.

In operation, a carbon dioxide liquid is applied to the top surface portion of the substrate 12 from the dispenser 17, and the substrate is rotated about an axis (which axis may or may not pass through the substrate) to distribute the carbon dioxide liquid on the top surface portion of the substrate. If desired, the liquid may be dispensed on the substrate and allowed to sit, or remain stationary thereon, for a period of time before spinning is initiated, as described in U.S. Pat. No. 4,281,057 to Castellani et al.

Either or (preferably) both of the applying step and the rotating step are carried out with the pressure in the chamber greater than atmospheric pressure: in general, with the pressure in the chamber being elevated by at least 10 or 20 pounds per square inch (psi) up to 5,000 or 10,000 psi. The temperature in the chamber is typically maintained at from −53 or −20° C. up to about 20 or 30° C. In addition, as discussed in greater detail below, either (or both) of the applying and spinning steps are carried out (in whole or in part) in an atmosphere comprising carbon dioxide (and other ingredients such as inert gases) while maintaining a differential partial pressure of carbon dioxide between the carbon dioxide liquid applied to the surface portion of the substrate and that atmosphere particularly the atmosphere immediately above the top surface portion of the substrate) of between about 10, 20 or 40 mm Hg to about 100, 200 or 400 mm Hg.

It may be desired to maintain an essentially constant atmosphere within the chamber as carbon dioxide liquid is applied during one (or more) application and spinning steps. In this case, an atmosphere of carbon dioxide and one or more additional gasses or inert gasses (e.g., helium, nitrogen, argon, oxygen) can be passed into the chamber via line 41 above and vented from the chamber via line 54 above in a controlled manner, so that the composition of the atmosphere within the chamber remains consistent as material is added to the chamber via dispenser 17.

The carbon dioxide liquid, when used to remove previously applied materials from the substrate, may consist essentially of carbon dioxide, with minor ingredients such as one or more cosolvents (e.g., tetrahydrofuran, cyclohexane, alcohols such as methanol or ethanol, etc.).

When used as a carrier for a compound to be distributed and deposited on the top surface portion of the substrate, the carbon dioxide liquid is a mixture that contains carbon dioxide, optionally one or more cosolvents, and one or more compounds to be carried. Exemplary compounds that may be carried by the carbon dioxide liquid include, but are not limited to, polymers (including polymer precursors or monomers that polymerize or are .polymerized after deposition), resists (e.g., photoresists, electron resists, x-ray resists), adhesion promoters, antireflective coatings, and sol-gel precursors. Resists such as photoresists may also contain additives to improve lithographic performance including dissolution inhibitors, photo acid generators, and the like. The photo acid generators are present to allow for chemically amplified resist technology. The mixture may be in any physical form, including solutions, dispersions, and emulsions, but preferably the mixture is a solution. In a preferred embodiment, the mixture is comprised of carbon dioxide and a fluoropolymer, and more preferably a fluoroacrylate polymer. Examples of such mixtures are disclosed as the polymerization product described in U.S. Pat. No. 5,496,901 to DeSimone, the disclosure of which is incorporated herein by reference. In a preferred embodiment, such mixtures are applied to the top surface portion of a semiconductor (e.g., silicon) substrate to serve as a photoresist.

The carbon dioxide liquid may contain a viscosity modifier such as an associative polymer to increase the viscosity thereof and alter the thicknesss of the surface coating. The viscosity modifier may, for example, be included in an amount sufficient to increase the viscosity of the carbon dioxide liquid up to about 500 or 1000 centipoise.

The carbon dioxide liquid may contain a surface tension modifier (e.g., a surfactant) to increase or decrease the surface tension by an amount up to about plus or minus 5 dynes per centimeter. Surface tension modifiers may be included to increase or decrease droplet formation at the boundary of the carbon dioxide liquid coating formed on the substrate during spinning thereof. Surfactants used as such surface tension modifiers should include a $CO_2$-philic group and a $CO_2$-phobic group and are known in the art. See, e.g., U.S. Pat. No. 5,312,882 to DeSimone et al.; U.S. Pat. No. 5,683,977 to Jureller et al. (the disclosures of which are incorporated by reference herein in their entirety).

If desired, the carbon dioxide liquid may contain a co-solvent that evaporates more slowly than does carbon dioxide (e.g., alcohols, ketones such as cyclopentanone, butyl acetate, xylene). Substrates coated with such a carbon dioxide liquid may then be removed from the pressure vessel and dryed (e.g., in a separate drying oven, as described in U.S. Pat. No. 4,794,021 to Potter). Such a technique may be employed to reduce pin holes in the coating formed on the substrate.

Figure 2:
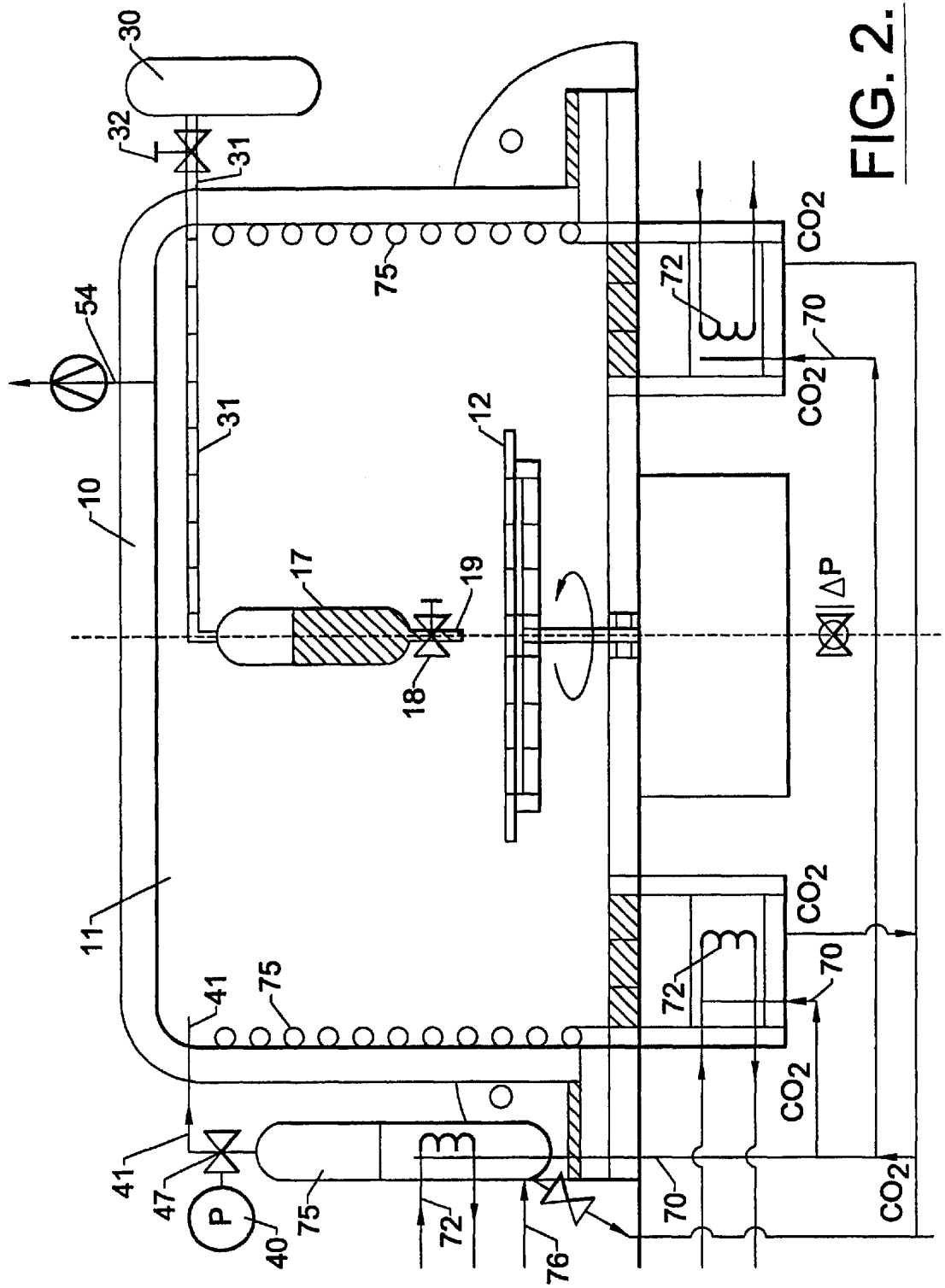
FIG. 2 is a side view of a second embodiment of an apparatus of the present invention that maintains a differential partial pressure of carbon dioxide between carbon dioxide in the chamber atmosphere and carbon dioxide liquid deposited on the substrate.

The apparatus disclosed in FIG. 2 is similar to the apparatus disclosed in FIG. 1, and includes a pressure vessel having an enclosed chamber therein, a substrate, a turntable comprised of a holder and a spinning mechanism, differential pressure leads, and a liquid dispenser positioned in the enclosed chamber above the substrate so that it can deposit a carbon dioxide liquid on the substrate through valve 18 to nozzle 19. A pressure reservoir 30 for storing a carbon dioxide liquid is located outside of the chamber and is in fluid communication with the liquid dispenser by line under control of valve. A pump is again connected to the chamber by line and valve to elevate the pressure within the chamber. A liquid carbon dioxide pool 60 in the pressure vessel is supplied with a carbon dioxide liquid by lines 70 and has cooling coils 72 placed therein. A temperature controller (not shown) is provided for the cooling coils to maintain a temperature difference between a carbon dioxide liquid in the pool and the carbon dioxide liquid deposited on the substrate (which may be determined by an infra-red monitor or other suitable temperature sensor positioned within the chamber and directed at the top surface of the substrate, and operatively associated with the temperature controller). This serves as a differential pressure control means for maintaining a differential partial pressure of carbon dioxide between the carbon dioxide liquid applied to the surface portion of the substrate and that atmosphere, as discussed above. In a preferred embodiment, where only a 0.01 or 0.05 to 0.1 or 0.5 atmosphere partial pressure difference is required, the temperature is controlled to plus or minus 1 or 0.1 degrees Centigrade, with the temperature of the liquid in the pool being cooler than that of the liquid on the substrate. It should also be noted that, as an alternate to sensing temperature, a different parameter, such as film thickness of the carbon dioxide liquid on the surface of the substrate, may be measured, and the partial pressure of carbon dioxide regulated in response thereto.

An alternate means for maintaining a differential partial pressure of carbon dioxide is also provided in FIG. 2 in the form of cooling coils 75 for cooling the walls of the chamber to cause some condensation to occur on the walls of the chamber, and thus remove carbon dioxide from the vapor phase above the spinning substrate.

A still additional means for maintaining a differential partial pressure is to equilibrate the atmosphere with liquid carbon dioxide at the same temperature as the liquid being deposited, but add very small flow rates of an inert gas via innert gas supply line 41 at the same time that gas and vapor are removed from the chamber by fan in order to lower the partial pressure of carbon dioxide. In the illustrated embodiment, pressure vessel 75 contains a carbon dioxide liquid pool, and is supplied with an inert gas (e.g., nitrogen) via line 76 which passes through the carbon dioxide pool so that the inert gas is provided in a carbon dioxide-saturated atmosphere.

As will be apparent to those skilled in the art, the methods and apparatus of the present invention may employ any one or any combination of such means for maintaining a partial pressure of carbon dioxide.

FIG. 3 is a schematic view of an automated multiple substrate spin coating station. The device includes a pressure vessel and a turntable, essentially as described above. A robotic arm 90 is equipped with a robotic grasping member 91. A substrate shuttle car 92, shown in the main chamber, is provided on a pair of alignment rails 93, 94. Shuttle cars are moved by drive systems in accordance with standard techniques. An an ante chamber 95 (which serves as a pressure lock) outside the main chamber provides a starting point for the shuttle car. A receiving chamber 96 (containing a second shuttle car as illustrated; also serves as a pressure lock) is provided for receiving a shuttle car after all substrates on that shuttle car have been treated. Both the ante-chamber and receiving chamber are provided with separate internal and external sealable doors (not shown), which doors enable both chambers to serve as pressure locks while the shuttle cars are inserted and removed so that the main chamber need not be fully depressurized to insert a new shuttle car. A removable fluid splash barricade 97 around the turntable prevents excess liquid from splashing onto the shuttle car, substrates, and robotic arm. The fluid barricade, robotic arm, grasping member, and shuttle cars may all be driven by standard drive techniques and the operation thereof coordinated with a controller, such as a programmable computer, in accordance with standard techniques. Together, the robotic arm and shuttle car serve as an exchanging exchanging means positioned within the enclosed chamber for exchanging a first substrate with a second substrate on said turntable without the need for opening said pressure vessel. As will be appreciated, the exchanging means need not have a shuttle car and pressure lock system as shown, and may instead have one or more stationary racks inside the main chamber, or may employ a single pressure lock.

The foregoing is illustrative of the present invention, and is not to be construed as limiting thereof. For example, means other than those described above may be employed for handling the substrates while minimizing pressure loss from the pressure chamber. By way of example, the extendible robotic arm may be mounted on a track or framework of tracks configured to move the grasping member between the substrate holder and the shuttle car. The shuttle car may itself be eliminated, the arm and associated movement mechanism(s) being adapted to move the grasping member between the ante chamber and the receiving chamber. In each case, the mechanical grasping member may be replaced with a suction head. In addition to or in place of the arm, retractable conveyor belts may be positioned to carry the substrate away from the holder. A turntable or other rack system carrying different substrates could be employed. Numerous additional variations or alternatives to the foregoing means will be readily apparent to those skilled in the art. Accordingly, the invention is defined by the following claims, with equivalents of the claims to be included therein.

That which is claimed is:

1. A spin coating apparatus for applying a carbon dioxide liquid to a substrate, said apparatus comprising:

a pressure vessel having an enclosed chamber therein;

a holder for rotating a substrate positioned in said enclosed chamber;

a liquid dispenser positioned in said enclosed chamber for depositing a carbon dioxide liquid on said substrate;

a pressure reservoir in fluid communication with said liquid dispenser for storing a carbon dioxide liquid; and differential pressure control means operatively associated with said pressure vessel for maintaining a differential pressure of carbon dioxide between an atmosphere in said enclosed chamber and a carbon dioxide liquid deposited on said substrate, wherein said differential pressure control means comprises an inert gas supply line in fluid communication with said enclosed chamber.

2. An apparatus according to claim 1, wherein said differential pressure control means comprises a liquid carbon dioxide reservoir in said pressure vessel and a temperature controller configured for maintaining a temperature difference between a carbon dioxide liquid in said reservoir and the carbon dioxide liquid deposited on said substrate.

3. An apparatus according to claim 1, further comprising a pressure controller operatively associated with said pressure vessel.

4. An apparatus according to claim 1, further comprising a pressure lock connected to said pressure vessel to facilitate placing or removing a substrate from said chamber.

5. An apparatus according to claim 1, further comprising exchanging means positioned within said enclosed chamber for exchanging a first substrate with a second substrate on said holder.

6. A spin coating apparatus for applying a carbon dioxide liquid to a substrate, said apparatus comprising:
  a pressure vessel having an enclosed chamber therein;
  a holder for rotating a substrate positioned in said enclosed chamber;
  a liquid dispenser positioned in said enclosed chamber for depositing a carbon dioxide liquid on said substrate;
  a pressure reservoir in fluid communication with said liquid dispenser for storing a carbon dioxide liquid; and
  differential pressure control means operatively associated with said pressure vessel for maintaining a differential pressure of carbon dioxide between an atmosphere in said enclosed chamber and a carbon dioxide liquid deposited on said substrate, wherein said differential pressure control means comprises a cooling apparatus operatively associated with said pressure vessel to cool a wall of said pressure vessel.

7. An apparatus according to claim 6, wherein said differential pressure control means comprises a liquid carbon dioxide reservoir in said pressure vessel and a temperature controller configured for maintaining a temperature difference between a carbon dioxide liquid in said reservoir and the carbon dioxide liquid deposited on said substrate.

8. An apparatus according to claim 6, further comprising a pressure controller operatively associated with said pressure vessel.

9. An apparatus according to claim 6, further comprising a pressure lock connected to said pressure vessel to facilitate placing or removing a substrate from said chamber.

10. An apparatus according to claim 6, further comprising exchanging means positioned within said enclosed chamber for exchanging a first substrate with a second substrate on said holder.

11. A spin coating apparatus for applying a carbon dioxide liquid to a substrate, said apparatus comprising:
  a pressure vessel having an enclosed chamber therein;
  a holder for rotating a substrate positioned in said enclosed chamber;
  a liquid dispenser positioned in said enclosed chamber for depositing a carbon dioxide liquid on said substrate;
  a pressure reservoir in fluid communication with said liquid dispenser for storing a carbon dioxide liquid; and
  differential pressure control means operatively associated with said pressure vessel for maintaining a differential pressure of carbon dioxide between an atmosphere in said enclosed chamber and a carbon dioxide liquid deposited on said substrate, wherein said differential pressure control means maintains a differential partial pressure of carbon dioxide between said atmosphere and said carbon dioxide liquid of between about 10 and 400 mm Hg.

12. An apparatus according to claim 11, wherein said differential pressure control means comprises a liquid carbon dioxide reservoir in said pressure vessel and a temperature controller configured for maintaining a temperature difference between a carbon dioxide liquid in said reservoir and the carbon dioxide liquid deposited on said substrate.

13. An apparatus according to claim 11, further comprising a pressure controller operatively associated with said pressure vessel.

14. An apparatus according to claim 11, further comprising a pressure lock connected to said pressure vessel to facilitate placing or removing a substrate from said chamber.

15. An apparatus according to claim 11, further comprising exchanging means positioned within said enclosed chamber for exchanging a first substrate with a second substrate on said holder.

* * * * *